United States Patent
Bales

(10) Patent No.: US 8,779,963 B1
(45) Date of Patent: Jul. 15, 2014

(54) RECONFIGURABLE MULTIPLE-PATH PIPELINE ADC ARCHITECTURE INCORPORATING MULTIPLE-INPUT SIGNAL-AVERAGING MDAC

(71) Applicant: Maxim Integrated Products, Inc., San Jose, CA (US)

(72) Inventor: James Edward Bales, Fort Collins, CO (US)

(73) Assignee: Maxin Integrated Products, Inc., San Jose, CA (US)

( * ) Notice: Subject to any disclaimer, the term of this patent is extended or adjusted under 35 U.S.C. 154(b) by 0 days.

(21) Appl. No.: 13/796,592

(22) Filed: Mar. 12, 2013

(51) Int. Cl.
*H03M 1/38* (2006.01)
*H03M 1/00* (2006.01)

(52) U.S. Cl.
CPC .................................. *H03M 1/004* (2013.01)
USPC ............................. 341/161; 341/144; 341/155

(58) Field of Classification Search
CPC ..... H03M 1/004; H03M 1/121; H03M 1/122; H03M 1/2216; H03M 1/20; H03M 1/167
USPC .................. 341/161, 122, 144, 155, 172, 165
See application file for complete search history.

(56) References Cited

U.S. PATENT DOCUMENTS

| | | | | |
|---|---|---|---|---|
| 5,448,239 A * | 9/1995 | Blumberg et al. | ............ | 341/166 |
| 7,333,039 B2 * | 2/2008 | Lu et al. | ......................... | 341/122 |
| 7,656,340 B2 * | 2/2010 | Gribok et al. | ................. | 341/161 |
| 7,764,215 B2 * | 7/2010 | Wan et al. | ...................... | 341/163 |
| 8,390,487 B2 * | 3/2013 | Ali | ................................ | 341/118 |
| 8,581,769 B2 * | 11/2013 | Kumar et al. | ................. | 341/161 |

* cited by examiner

*Primary Examiner* — Peguy Jean Pierre

(57) ABSTRACT

A pipeline analog-to-digital converter (ADC) includes a first conversion stage of the pipeline ADC that receives an input signal and that comprises, in a first signal path, a first ADC that converts the input signal, a first digital-to-analog converter (DAC) that converts an output of the first ADC, a first subtractor that subtracts an output of the first DAC from the input signal, and a first amplifier that amplifies an output of the first subtractor and generates a first residue of the first conversion stage; and in a second signal path, a second DAC that converts the output of the first ADC, a second subtractor that subtracts an output of the second DAC from the input signal, and a second amplifier that amplifies an output of the second subtractor and generates a second residue of the first conversion stage. A control module selectively enables and disables the second path.

16 Claims, 8 Drawing Sheets

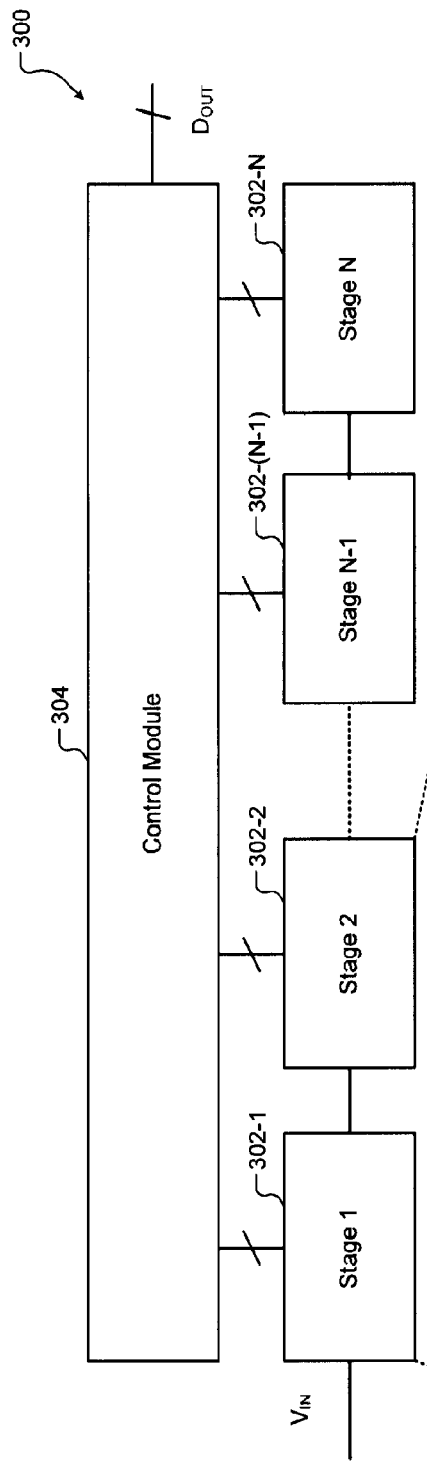
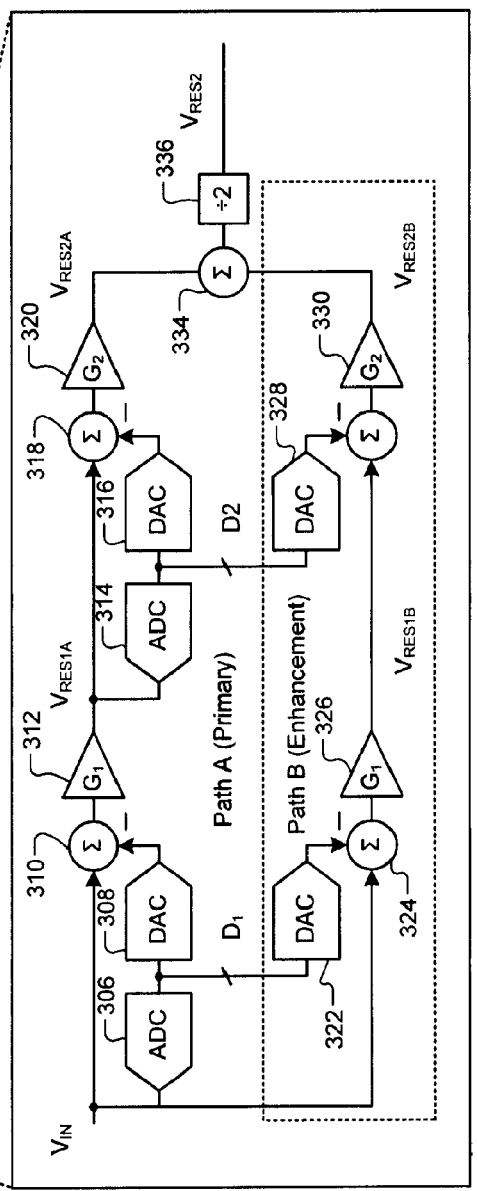
FIG. 4A
FIG. 4B

RECONFIGURABLE MULTIPLE-PATH PIPELINE ADC ARCHITECTURE INCORPORATING MULTIPLE-INPUT SIGNAL-AVERAGING MDAC

FIELD

The present disclosure relates generally to analog-to-digital converters (ADC's) and more particularly to a reconfigurable multiple-path pipeline ADC incorporating a multiple-input signal-averaging multiplying digital-to-analog converter (MDAC).

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

A pipeline analog-to-digital-converter (ADC) includes multiple stages. An analog input is first sampled and held steady by a sample-and-hold (S&H) circuit while a flash ADC in a first stage (Stage 1) quantizes it to N bits. The N-bit output is then fed to an N-bit DAC, and an analog output of the N-bit DAC is subtracted from the analog input to generate a residue. The residue is amplified and fed to a next stage (Stage 2). The amplified residue continues through the pipeline, providing N bits per stage until it reaches an M-bit flash ADC in the last stage, which resolves the last M LSB bits. Because the bits from each stage are determined at different points in time, all the bits corresponding to the same sample are time-aligned with shift registers before being fed to a digital error-correction logic. When a stage finishes processing a sample, determining the bits, and passing the residue to the next stage, the stage can then start processing the next sample received from the sample-and-hold embedded within each stage. This pipelining action provides high throughput.

SUMMARY

A pipeline analog-to-digital converter (ADC) comprises a first conversion stage of the pipeline ADC that receives an input signal. The first conversion stage comprises, in a first signal path, a first ADC that converts the input signal, a first digital-to-analog converter (DAC) that converts an output of the first ADC, a first subtractor that subtracts an output of the first DAC from the input signal, and a first amplifier that amplifies an output of the first subtractor and generates a first residue of the first conversion stage. The first conversion stage comprises, in a second signal path, a second DAC that converts the output of the first ADC, a second subtractor that subtracts an output of the second DAC from the input signal, and a second amplifier that amplifies an output of the second subtractor and generates a second residue of the first conversion stage. A control module selectively enables and disables the second path.

In other features, the pipeline ADC further comprises a second conversion stage of the pipeline ADC. The second conversion stage comprises, in the first signal path, a second ADC that converts the first residue, a third DAC that converts an output of the second ADC, a third subtractor that subtracts an output of the third DAC from the first residue, and a third amplifier that amplifies an output of the third subtractor and generates a third residue of the second conversion stage. The second conversion stage comprises, in the second signal path, a fourth DAC that converts the output of the second ADC when the control module enables the second path, a fourth subtractor that subtracts an output of the fourth DAC from the second residue, and a fourth amplifier that amplifies an output of the fourth subtractor and generates a fourth residue of the second conversion stage.

In other features, the pipeline ADC further comprises a first adder that adds the third residue and the fourth residue when the control module enables the second path, and a first divider that divides an output of the first adder.

In other features, the pipeline ADC further comprises a third conversion stage of the pipeline ADC. The third conversion stage comprises a third ADC that converts an output of the first divider, a fifth DAC that converts an output of the third ADC, a fifth subtractor that subtracts an output of the fifth DAC from the output of the first divider, and a fifth amplifier that amplifies an output of the fifth subtractor and generates a fifth residue of the third conversion stage. The control module generates a digital representation of the input signal based on the outputs of the first, second, and third ADCs.

In other features, the pipeline ADC further comprises a third conversion stage of the pipeline ADC. The third conversion stage comprises a third ADC that converts an output of the third amplifier when the control module disables the second path, a fifth DAC that converts an output of the third ADC, a fifth subtractor that subtracts an output of the fifth DAC from the output of the third amplifier, and a fifth amplifier that amplifies an output of the fifth subtractor and generates a fifth residue of the third conversion stage. The control module generates a digital representation of the input signal based on the outputs of the first, second, and third ADCs.

In other features, the pipeline ADC further comprises a first adder that adds the first residue and the second residue when the control module enables the second path, a first divider that divides an output of the first adder, a second adder that adds the first residue and the second residue when the control module enables the second path, and a second divider that divides an output of the second adder.

In other features, the pipeline ADC further comprises a second conversion stage of the pipeline ADC. The second conversion stage comprises, in the first signal path, a second ADC that converts an output of the first amplifier, a third DAC that converts an output of the second ADC, a third subtractor that subtracts an output of the third DAC from the output of the first divider, and a third amplifier that amplifies an output of the third subtractor and generates a third residue of the second conversion stage. The second conversion stage comprises, in the second signal path, a fourth DAC that converts the output of the second ADC, a fourth subtractor that subtracts an output of the fourth DAC from the output of the second divider, and a fourth amplifier that amplifies an output of the fourth subtractor and generates a fourth residue of the second conversion stage.

In other features, the pipeline ADC further comprises a third adder that adds the third residue and the fourth residue, and a third divider that divides an output of the third adder.

In other features, the pipeline ADC further comprises a third conversion stage of the pipeline ADC. The third conversion stage comprises a third ADC that converts an output of the third divider, a fifth DAC that converts an output of the third ADC, a fifth subtractor that subtracts an output of the fifth DAC from the output of the third divider, and a fifth amplifier that amplifies an output of the fifth subtractor and generates a fifth residue of the third conversion stage. The control module generates a digital representation of the input signal based on the outputs of the first, second, and third ADCs.

In still other features, a system comprises a sampling circuit including a plurality of capacitances; a plurality of switches; an active charge transfer circuit having a first input connected to the common potential, a second input, and an output; and a control module that controls the plurality of switches. Each of the capacitances has a first end connected to a common potential, and a second end. During a sampling phase, the plurality of switches connects a first signal to a first set of the capacitances, and a second signal to a second set of the capacitances. During an amplifying phase following the sampling phase, the plurality of switches disconnects the first and second signals from the first and second sets of the capacitances, connects a plurality of reference voltages to the second input of the active charge transfer circuit via a third set of the capacitances, and connects a fourth set of the capacitances to the second input and the output of the active charge transfer circuit.

In other features, the output of the active charge transfer circuit includes an average of the first and second signals.

In other features, the system further comprises a conversion stage of a pipeline analog-to-digital converter (ADC) that includes two conversion paths and that generates the first and second signals representing two residues of the conversion stage via the two conversion paths.

In other features, the control module disables one of the two conversion paths and connects one of the first and second signals to the plurality of capacitances.

In still other features, a pipeline analog-to-digital converter (ADC) comprises first, second, third conversion stages, a first adder, a first divider, and a control module. The first conversion stage includes two conversion paths, converts an input signal via the two conversion paths, and generates a first output and first and second residues. The second conversion stage includes two conversion paths and generates a second output and third and fourth residues via the two conversion paths based on the first and second residues. The first adder adds the third and fourth residues. The first divider divides an output of the first adder. The third conversion stage generates a third output based on an output of the first divider. The control module generates a digital representation of the input signal based on the outputs of the first, second, and third conversion stages.

In other features, the pipeline ADC further comprises a second adder that adds the first and second residues, a second divider that divides an output of the second adder, a third adder that adds the first and second residues, and a third divider that divides an output of the second adder. The second conversion stage includes a first ADC that generates the second output based on the first residue, a first multiplying DAC that generates the third residue based on the second output and an output of the second divider, and a second multiplying DAC that generates the fourth residue based on the second output and an output of the third divider.

In other features, the first conversion stage includes a first ADC that generates the first output based on the input signal, a first multiplying DAC that generates the first residue based on the first output and the input signal, and a second multiplying DAC that generates the second residue based on the input signal.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein:

FIG. 4A is a functional block diagram of a pipeline ADC that uses a plurality of conversion paths in one or more of a plurality of conversion stages;

FIG. 4B is a functional block diagram of a plurality of conversion stages of the pipeline ADC of FIG. 4A;

In the drawings, reference numbers may be reused to identify similar and/or identical elements.

DETAILED DESCRIPTION

Figure 1:
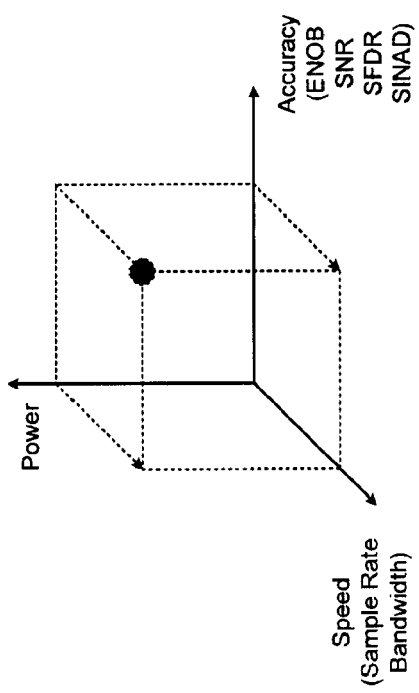
FIG. 1 depicts a performance space of an analog-to-digital converter (ADC) defined by speed, accuracy, and power.

Many systems that use analog-to-digital converters (ADC's) can benefit from the ability to place the ADC at different points in the power/accuracy (dynamic range) performance space to meet time variant system performance requirements. Although complete power-down during system idle periods is common, management of the ADC accuracy/power tradeoff versus time variant system requirements is not common. One possible implementation of this capability is to provide N parallel ADCs which can provide up to 10*log(N) dynamic range improvement at N times power dissipation.

Some applications employing a high-speed pipelined ADC can benefit by operating the ADC at reduced power levels and commensurately reduced dynamic range performance when maximum performance is not required. It is a common practice to provide adjustable bias to allow for variable power dissipation and performance. Adjustable bias can also be used with pipelined ADCs employing multiplying digital-to-analog converters (MDACs) to allow for variable power dissipation and performance. When this technique is applied to pipelined ADC employing MDACs, however, the variable bias power tends to have a much stronger effect on bandwidth and maximum sample rate than on signal-to-noise dynamic range.

One way to solve this problem is to provide 2 or more ADCs in parallel, which are driven by the input signal and whose outputs are summed in the digital domain. Assuming these parallel ADCs are identical, the SNR improvement relative to a single ADC is 10*log(N), and the power is N times the single ADC power. The required area for an IC implementation is N times the area of a single ADC plus the area required for a digital adder. The multi-path ADC architecture according to the present disclosure provides nearly 10*log(N) SNR improvement at substantially less than N times the power and area.

The present disclosure solves the problem of achieving efficient power and performance programmability through implementation of a reconfigurable multiple signal path pipelined architecture. The multiple signal paths share common circuitry and are limited to the first one or few stages of the overall pipeline. Since subsequent pipeline stages comprise a single path and a significant portion of circuitry is shared in the multiple path stages, significant power and area savings are achieved when compared to equivalent fully parallel ADCs.

The architecture of the present disclosure includes a circuit called a multiple-input signal-averaging multiplying digital-to-analog converter (MDAC). This circuit enables the function of programmable reconfigurability and provides an efficient and accurate way of combining the outputs of the multiple signal paths when the architecture is configured in the multiple path mode while maintaining the same efficiency and accuracy in a reduced or single path configuration.

The present disclosure provides an ADC architecture in which accuracy (SNR) scales with power dissipation through programmable control while maintaining a constant maximum sample rate. The architecture achieves this goal in a way that is more area and power efficient than simply operating multiple ADCs in parallel. The present disclosure relates specifically to pipeline ADC circuits that are implemented with charge transfer MDAC pipeline stages. The architecture provides multiple signal paths, which can be reconfigured using programming. The reconfigurability and optimal performance in various configurations is made feasible by a circuit in which an MDAC input selects multiple input signals and provides a transfer function that operates on the average of the input signals. The circuit is called multiple-input signal-averaging MDAC.

The circuits shown in the figures (except FIGS. 7A and 7B) are shown as single-ended circuits for simplicity of illustration. It will be understood, however, that the teachings of the present disclosure can be easily applied to differential circuits. Further, throughout the present disclosure, only two signal/conversion paths are shown in the initial conversion stages of a pipeline ADC for example only. It will be understood, however, that the teachings of the present disclosure can be easily extended to three or more signal/conversion paths in the initial conversion stages of a pipeline ADC.

Referring now to FIG. 1, the performance of an ADC, in most simple terms, is defined by speed, accuracy, and power. Every ADC, regardless of programmability, operates at a given time at a discrete point in the performance space as shown in FIG. 1. Many systems that require ADCs can benefit from the ability to place the ADC at different points in the performance space to meet time varying system requirements. This flexibility can be subdivided into two categories of programmability and reconfigurability. Programmability refers to the ability to change parameters, such as bias current, to change the operating point in the performance space. Reconfigurability refers to modification of the architecture or circuit configuration to change the operating point in the performance space.

One way to reduce power is to simply reduce the bias current in the amplifiers and other active circuits in the ADC. In switched-capacitor MDAC-based pipeline ADCs, the primary consequence of reduced bias current is lower circuit bandwidth and reduced maximum sample rate. Typically, the accuracy reduction associated with reduced bias current is a much smaller effect as long as the ADC is operating below its maximum sample rate. Thus, bias programmability is a commonly used technique to design programmable ADCs in which maximum sample rate is programmable and power dissipation is minimized for the programmed maximum sample rate.

Figure 3:
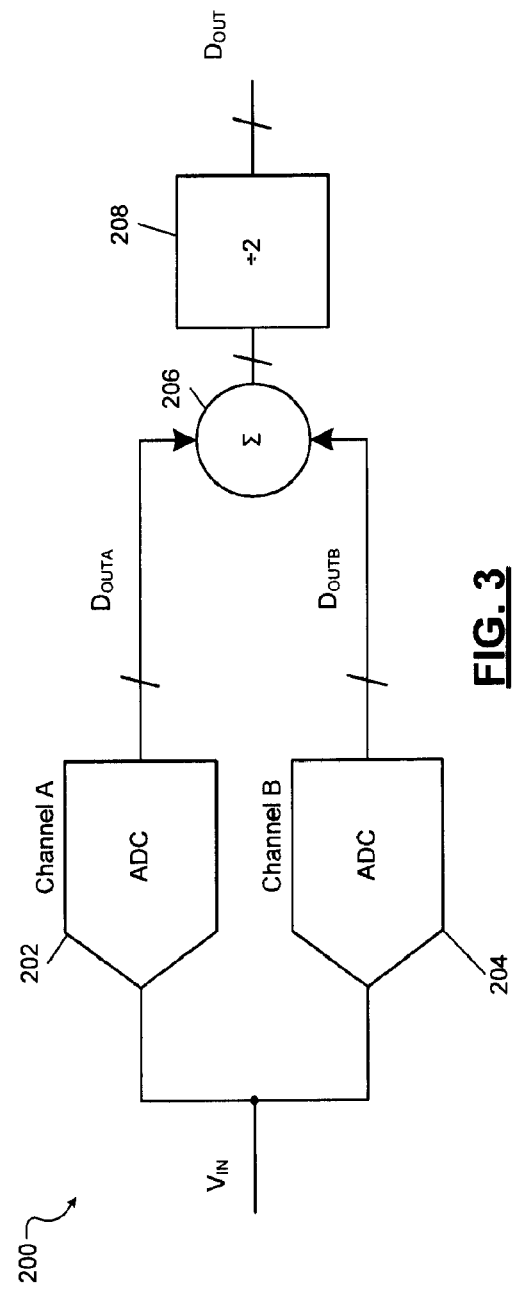
FIG. 3 is a functional block diagram of a pipeline ADC that can be reconfigured using full parallel paths.
Figure 2A:
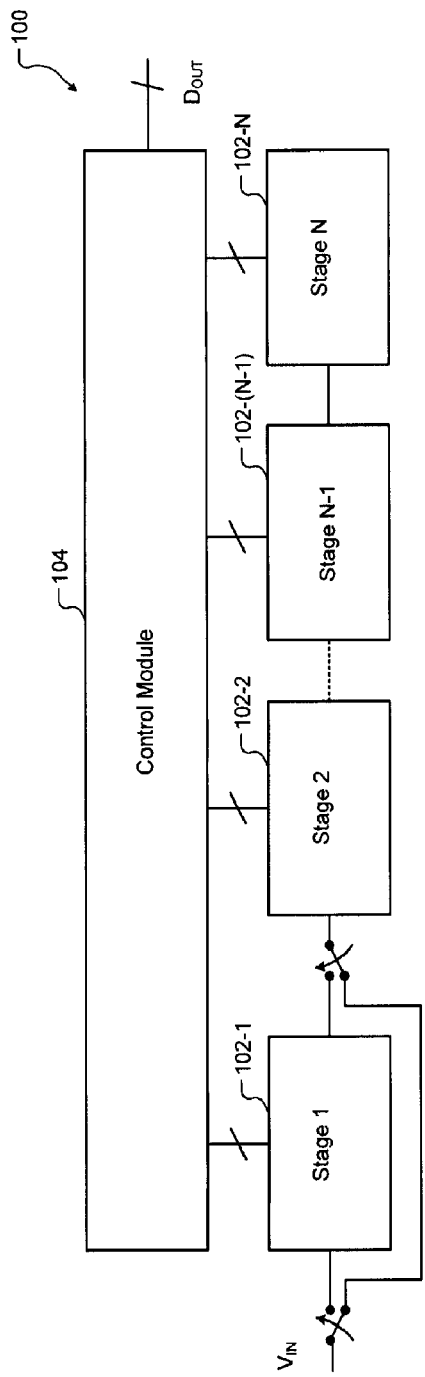
FIG. 2A is a functional block diagram of a pipeline ADC that can be reconfigured by bypassing one of a plurality of conversion stages.

The design of ADCs that can be programmed for SNR (accuracy) performance that scales with power dissipation while maintaining a constant maximum sample rate is a significantly more challenging problem. This challenge is typically met with some form of reconfigurable design in which the active architecture can be modified through programmable control. FIGS. 2A-3 show examples of reconfigurable pipeline ADC architectures that can provide programmable performance commensurate with power dissipation.

Figure 2B:
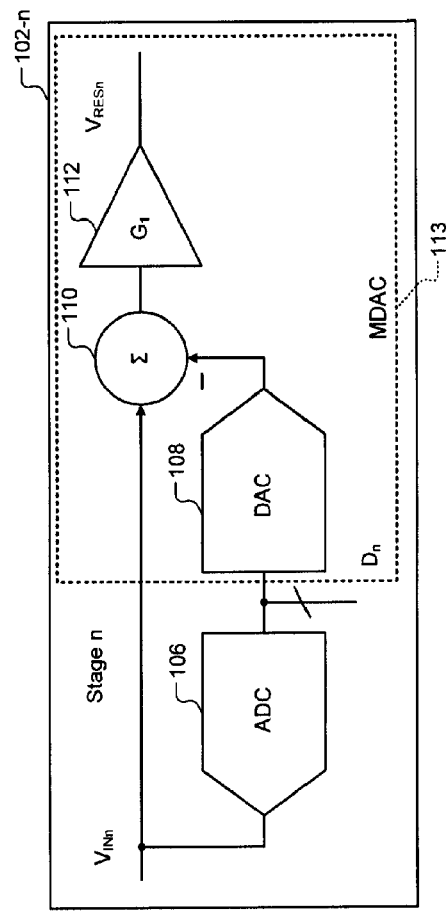
FIG. 2B is a functional block diagram of a conversion stage of the pipeline ADC of FIG. 2A.

Referring now to FIGS. 2A and 2B, a first example of a reconfigurable pipeline ADC architecture that can provide programmable performance commensurate with power dissipation is shown. In FIG. 2A, the first example shows a stage-bypass reconfigurable pipeline ADC architecture 100. The pipeline ADC 100 includes N stages connected in a pipeline configuration. The N stages of the pipeline ADC 100 include stage 1 102-1, stage 2 102-2, . . . , and stage N 102-N, where N is an integer greater than 1 (collectively stages 102). Additionally, the ADC 100 includes a control module 104.

In FIG. 2B, as an example of the stages 102 of the pipeline ADC 100, an $n^{th}$ stage 102-n of the pipeline ADC 100 is shown in detail. The stage 102-n includes an ADC 106, a DAC 108, a subtractor 110, and an amplifier 112. The ADC 106 receives as input a residue output by a previous stage (or the input signal of the pipeline ADC 100 if the stage is the first stage, or the second stage with the first stage bypassed). The output of the ADC 106 is input to the DAC 108. The subtractor 110 subtracts the output of the DAC 108 from the input of the stage 102-n. The amplifier 112 amplifies the output of the subtractor 110 and generates a residue of the stage 102-n.

The output of the ADC 106 is also input to the control module 104. The control module 104 generates the output of the pipeline ADC 100 based on the outputs received from all the stages 102. Specifically, the control module 104 time aligns (i.e., synchronizes) and adds bits output by the stages 102 and generates the output of the pipeline ADC 100. In the example shown in FIGS. 2A and 2B, a stage such as stage 1 of the pipeline ADC 100 can be bypassed to reduce power to provide programmable performance commensurate with power dissipation.

In FIG. 2B, an MDAC 113 implements the DAC 108, the subtractor 110, and the amplifier 112. Throughout the present disclosure, the MDACs are shown to include an operational amplifier for example only. However, the scope of the present disclosure is not limited to operational amplifiers only. In general, the MDACs may be implemented using any other active charge transfer circuit instead of the operational amplifier. Another example of an active charge transfer circuit is a zero-crossing amplifier. The MDACs may be implemented using a zero-crossing detector instead of an operational amplifier. The term active charge transfer circuit as used herein refers to a circuit comprising active semiconductor components and having high input impedance and low output impedance. The operational amplifier and the zero-crossing detector are examples of active charge transfer circuits.

High-precision switched-capacitor circuits such as ADCs rely on accurate charge transfer between capacitors. The process of transferring charge accurately between capacitors can be performed using operational amplifiers as well as zero-crossing detectors. A traditional pipeline ADC stage uses an op-amp in feedback to force its input to a virtual ground condition. This process forces charge transfer from a capacitor in feedback path to a capacitor at the input. The op-amp can be replaced by a comparator or a zero-crossing detector. The comparator detects the instant when the input crosses virtual ground as the output of that stage is ramped from low to high. The comparator output is then used to determine the instant when the next stage samples. Other additional active charge transfer circuits are contemplated.

Referring now to FIG. 3, a second example of a reconfigurable pipeline ADC architecture that can provide programmable performance commensurate with power dissipation is shown. The second example shows a full parallel-path reconfigurable ADC architecture 200. The ADC 200 includes a dual path configuration, where the two paths are shown as Channel A and Channel B.

The ADC 200 includes a first ADC 202, a second ADC 204, an adder 206, and a divider 208. The first ADC 202 and the second ADC 204 are connected in parallel. That is, the first ADC 202 and the second ADC 204 receive the same input. The adder 206 adds the outputs of the first ADC 202 and the second ADC 204. The divider 208 divides the output of the adder 206 to generate the output of the ADC 200. For the ADC 200, power requirement is 2×, area requirement is 2×, signal-to-noise and distortion ratio (SNDR) improvement is 3 dB, and resolution is increased by 1 bit (effective number of bits (ENOB) by 0.5 bit).

Although the implementation with fully parallel ADCs is straightforward, it may not be the most area and power efficient approach. In a typical pipeline ADC, the first stage has the most significant effect on dynamic range and accuracy, while subsequent stages make decreasing contributions to overall accuracy. Recognizing this characteristic, the present disclosure provides a pipeline ADC with a partial parallel path architecture.

Referring now to FIGS. 4A and 4B, a pipeline ADC 300 with a partial parallel path architecture according to the present disclosure is shown. In FIG. 4A, the pipeline ADC 300 includes N stages connected in a pipeline configuration. The N stages of the pipeline ADC 300 include stage 1 302-1, stage 2 302-2, . . . , and stage N 302-N, where N is an integer greater than 1 (collectively stages 302). Additionally, the pipeline ADC 300 includes a control module 304 that time aligns (i.e., synchronizes) and adds bits output by the stages 302 and generates the output of the pipeline ADC 300.

In FIG. 4B, the stages 1 and 2 of the pipeline ADC 300 are shown in detail. The implementation shown provides 2 analog signal paths through the first 2 stages of the pipeline ADC 300 for example only. These signal paths are referred to as primary path (Path A) and enhancement path (Path B). The control module 304 can switch off the enhancement path to reduce power consumption at lower overall SNR. When the enhancement path is switched off, the control module 304 bypasses the sum and divide-by-two functions, and the second residue is taken directly from the primary path stage 2 output.

The stages 1 and 2 of the pipeline ADC 300 include the following components. In the primary path, the stage 1 302-1 includes a first ADC 306, a first DAC 308, a first subtractor 310, and a first amplifier 312. A first MDAC implements the first DAC 308, the first subtractor 310, and the first amplifier 312. The stage 2 302-2 includes a second ADC 314, a second DAC 316, a second subtractor 318, and a second amplifier 320. A second MDAC implements the second DAC 316, the second subtractor 318, and the second amplifier 320. In the enhancement path, the stage 1 302-1 includes a third DAC 322, a third subtractor 324, and a third amplifier 326. A third MDAC implements the third DAC 322, the third subtractor 324, and the third amplifier 326. The stage 2 302-2 includes a fourth DAC 328, a fourth subtractor 330, and a fourth amplifier 332. A fourth MDAC implements the fourth DAC 328, the fourth subtractor 330, and the fourth amplifier 332.

In the primary path, the first ADC 306 receives the input signal of the pipeline ADC 300. The output of the first ADC 306 is input to the first DAC 308. The first subtractor 310 subtracts the output of the first DAC 308 from the input of the pipeline ADC 300. The first amplifier 312 amplifies the output of the first subtractor 310 and generates a first residue of the stage 1 302-1. The second ADC 314 receives the first residue of the stage 1 302-1. The output of the second ADC 314 is input to the second DAC 316. The second subtractor 318 subtracts the output of the second DAC 316 from the first residue of the stage 1 302-1. The second amplifier 320 amplifies the output of the second subtractor 318 and generates a second residue of the stage 2 302-2.

In the enhancement path, the third DAC 322 receives the output of the first ADC 306. The third subtractor 324 subtracts the output of the third DAC 322 from the input of the pipeline ADC 300. The third amplifier 326 amplifies the output of the third subtractor 324 and generates a third residue of the stage 1 302-1. The fourth DAC 328 receives the output of the second ADC 314. The fourth subtractor 330 subtracts the output of the fourth DAC 328 from the third residue of the stage 1 302-1. The fourth amplifier 326 amplifies the output of the fourth subtractor 330 and generates a fourth residue of the stage 2 302-2.

An adder 334 adds the second residue of the stage 2 302-2 and the fourth residue of the stage 2 302-2. A divider 336 divides the output of the adder 334 to generate a final residue of the stage 2 302-2. The adder 334 and the divider 336 and an MDAC (i.e., DAC, subtractor, and amplifier) of the following stage (e.g., stage 3) constitute a multiple-input signal-averaging MDAC, which is described below in detail with reference to FIGS. 5A and 5B.

The enhancement path shares a flash quantizer (ADC), MDAC switch control, clock timing circuits, reference, and other circuits not directly associated with the signal path (hence not shown). If noise sources in the two signal paths are uncorrelated, the dual path configuration provides processing gain through coherent summation of the signal and incoherent summation of the noise. If the two signal paths are identical and completely uncorrelated, the dual path configuration provides 3 dB SNR improvement relative to a single path. If the noise contribution of subsequent stages is small compared to the first two stages, which is typically the case, the overall ADC SNR improvement is very close to the dual path improvement of 3 dB. Since much of the circuitry in the dual path is shared, along with the single path of subsequent stages, the overall power and area required for the dual path configuration is significantly less than the power and area required for a full parallel ADC implementation.

While only two paths and only two stages are shown in FIGS. 4A and 4B, the teachings of the present disclosure can be extended to any number of signal paths and any number of stages. For example, only two paths may be used in only stage 1. Also, while the multiple paths are designed to have the same transfer function, the multiple paths need not be identical. For example, in some applications, it might be beneficial to scale the enhancement path to be larger such that overall SNR improvement is greater than 3 dB. Most practical implementations, however, may include 2 to 4 paths per stage for up to 2 stages.

Implementing the architecture shown in FIGS. 4A and 4B includes the following: adding signals in the analog domain, addressing gain and offset errors and mismatch between the two paths, adapting reference to variable load as configuration changes, and adapting input driver circuits to variable load as configuration changes.

Figure 5A:
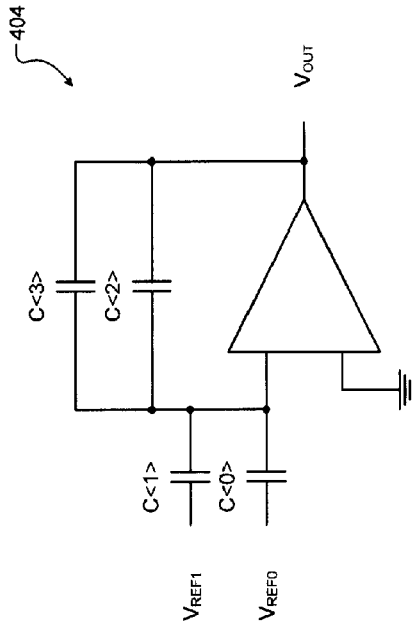
FIG. 5A is a schematic of a sampling phase of a multiple-input signal-averaging multiplying digital-to-analog converter (MDAC)
Figure 5B:
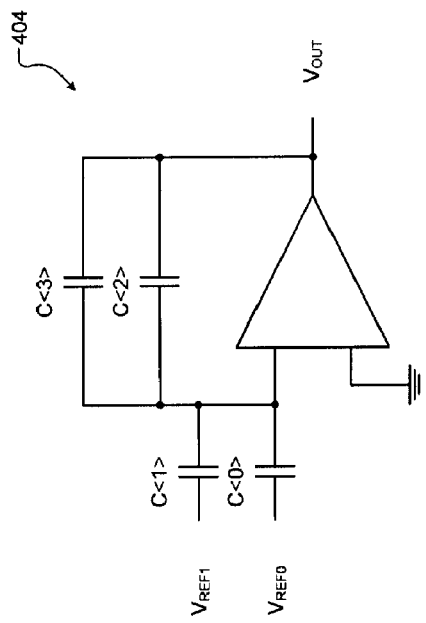
FIG. 5B is a schematic of an amplifying phase of the multiple-input signal-averaging MDAC.

Referring now to FIGS. 5A and 5B, a sampling phase 402 and an amplifying phase 404 of a multiple-input signal-averaging MDAC according to the present disclosure is shown. For example only, a basic and practical example of the multiple-input signal-averaging MDAC is shown and includes a two signal input 1.5-bit MDAC. The multiple-input signal-averaging MDAC adds signals efficiently without added noise in the analog domain.

In FIG. 5A, the sampling phase 402 of the multiple-input signal-averaging MDAC is shown. In FIG. 5B, the amplifying phase 404 of the multiple-input signal-averaging MDAC is shown. The sampling phase 402 and the amplifying phase 404 perform combining and scaling of the output residue signals of the multiple signal paths while also providing an efficient and accurate signal path in reduced and single-path configurations.

In FIG. 5A, the sampling phase 402 of the multiple-input signal-averaging MDAC includes a plurality of switches and a plurality of capacitances (C0-C3 in the example shown). The sampling phase 402 of the multiple-input signal-averaging MDAC receives as inputs the second residue of the stage 2 302-2 and the fourth residue of the stage 2 302-2. The plurality of switches connects the inputs to the capacitances as described below in detail.

In FIG. 5B, the amplifying phase 404 of the multiple-input signal-averaging MDAC includes an amplifier (e.g., an operational transconductance amplifier (OTA)). While an OTA is shown for example only, any other active charge transfer circuit such as a zero-crossing detector can be used instead. The plurality of capacitances of the sampling phase 402 are switched and connected to the amplifier as described below in detail.

In FIG. 5A, input $V_{INA}$ represents a residue output of a first of the multiple paths (e.g., Path A), and input $V_{INB}$ represents a residue output of a second of the multiple paths (e.g., Path B). Accordingly, input $V_{INA}$ represents residue output of stage 1 in Path A if only stage 1 uses multiple paths or residue output of stage 2 in Path A if stages 1 and 2 use multiple paths. Input $V_{INB}$ represents residue output of stage 1 in Path B if only stage 1 uses multiple paths or residue output of stage 2 in Path B if stages 1 and 2 use multiple paths.

During a sample phase of MDAC operation, input $V_{INA}$ is sampled on capacitors C<1> and C<3> while the input $V_{INB}$ is sampled on capacitors C<0> and C<2>. In the multiple signal path reconfigurable ADC architecture, input signals VINA and VINB are approximately equal, and the quantizer (not shown) that determines how the references will be connected in the amplify phase may be connected to either input signal. Alternatively, the signals could drive a two-input signal-averaging quantizer. In the MDAC amplify phase, capacitors C<2> and C<3> are connected around the operational transconductance amplifier (OTA). Capacitors C<0> and C<1> are connected to reference potentials that are determined by the quantizer during the MDAC sample phase. If the four capacitors are identical, the resulting transfer function is:

$$V_{OUT} = 2 \cdot \left[ \frac{V_{INA} + V_{INB}}{2} \right] - 0.5 \cdot [V_{REF1} + V_{REF0}]$$

This transfer function contains the input signal average term, multiplied by the residue gain of 2 term, along with the reference offset (subtraction of quantized input) term. Thus, the multiple path output residue averaging (sum and divide-by-two) shown in FIGS. 4A and 4B is absorbed in the following multiple-input signal-averaging MDAC stage. For example, in FIGS. 4A and 4B the adder 334 and the divider 336 can be part of stage 3 of the pipeline ADC 300. The control module 304 shown in FIGS. 4A and 4B controls the switches of the multiple-input signal-averaging MDAC.

Figure 6A:
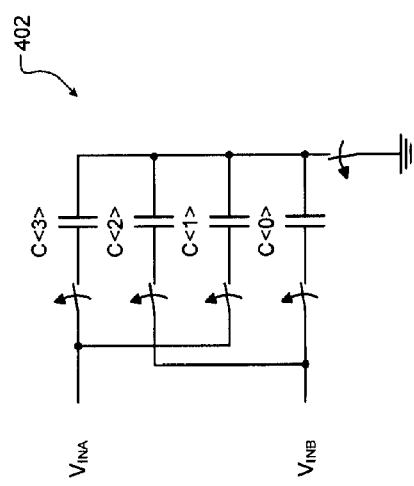
FIG. 6A is a schematic of the sampling phase of the multiple-input signal-averaging MDAC operating in a single input mode.
Figure 6B:
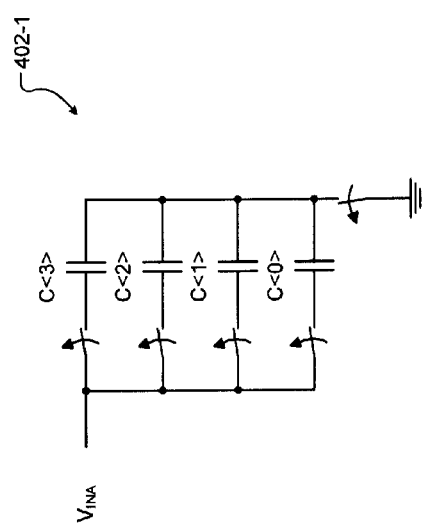
FIG. 6B is a schematic of the amplifying phase of the multiple-input signal-averaging MDAC.

Referring now to FIGS. 6A and 6B, the same multiple-input signal-averaging MDAC can support a single-path configuration of the pipeline ADC 300 as shown. In FIG. 6A, the sampling phase 402-1 receives a single input from a single path of the pipeline ADC 300. For example, input $V_{INA}$ represents a residue output of stage 1 or stage 2 of the pipeline ADC 300. In FIG. 6B, the amplifying phase 404 is the same as shown in FIG. 5B. In this configuration, the MDAC provides the transfer function:

$$V_{OUT} = 2 \cdot V_{INA} - 0.5 \cdot [V_{REF1} + V_{REF0}]$$

Figure 7B:
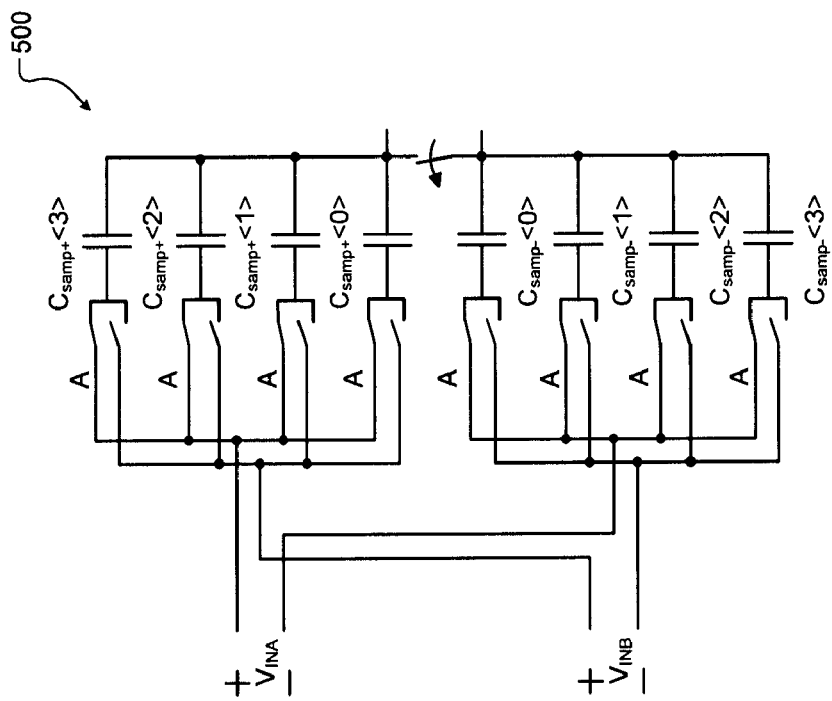
FIGS. 7A and 7B depict a selectable single-input or two-input sampling phase of a multiple-input signal-averaging MDAC.
Figure 7A:
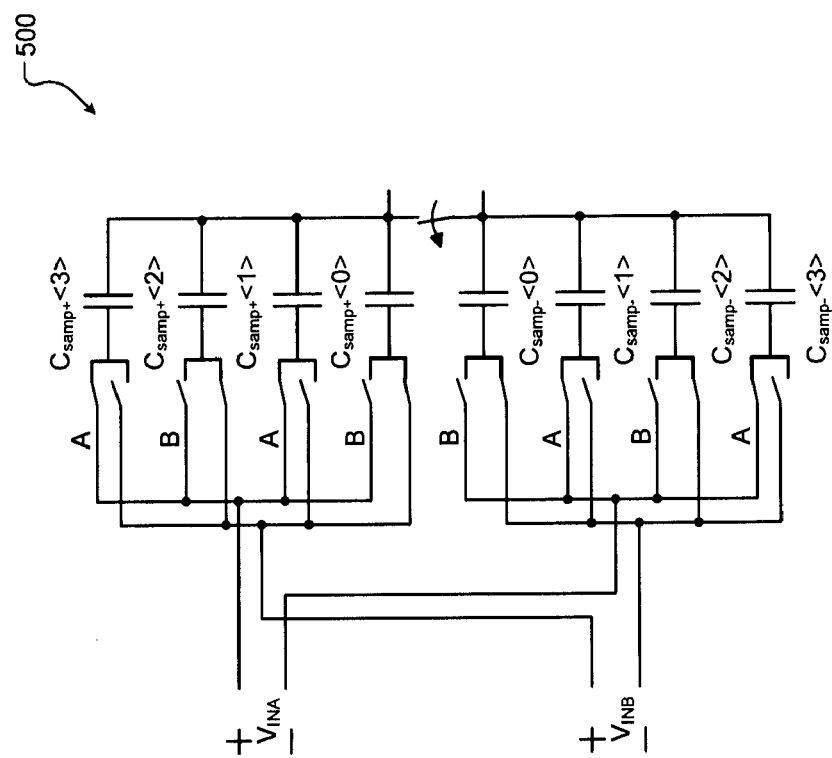

Referring now to FIGS. 7A and 7B, a multiple-input signal-averaging MDAC (e.g., the multiple-input signal-averaging MDAC) can include switches for selecting input signals so that the same multiple-input signal-averaging MDAC can support both single-path and dual-path input configurations in a dual-path reconfigurable ADC (e.g., the pipeline ADC 300 shown in FIGS. 4A and 4B). The switches can determine the source of the input signal during the sample phase. For a two-path implementation, this represents a very modest increase in complexity from a single switch per sampling capacitor to two switches per sampling capacitor as shown in FIGS. 7A and 7B.

In FIGS. 7A and 7B, a sampling phase 500 of a two-input signal-averaging MDAC is shown. While all other circuits are shown as single-ended circuits, a differential configuration is shown in FIGS. 7A and 7B for example only. The sampling phase 500 can work with the multiple-input signal-averaging MDAC having two paths regardless of whether the multiple-input signal-averaging MDAC is configured to operate using a single path or two paths. When the multiple-input signal-averaging MDAC is configured to operate using two paths, the switches select the inputs VINA and VINB for the sampling phase 500 as shown in FIG. 7A. When the multiple-input signal-averaging MDAC is configured to operate using a single path, the switches select the input VINA for the sampling phase 500 as shown in FIG. 7B. In FIGS. 7A and 7B, an amplifying phase having a differential configuration can be shown similar to the amplifying phase 404 having a single-ended configuration shown in FIGS. 5B and 6B but is omitted for simplicity of illustration. The control module 304 shown in FIGS. 4A and 4B controls the switches of sampling phase 500 and the amplifying phase of the multiple-input signal-averaging MDAC.

The multiple-input signal-averaging MDAC circuit according to the present disclosure provides the following benefits: The circuit supports ADC multiple path reconfigurability with signal input selection switches. The circuit integrates the multiple path residue output combining and averaging functions directly into the subsequent stage MDAC with no additional circuits or power dissipation. The circuit provides signal isolation between multiple output residue signals. The circuit provides DC isolation between multiple output residue nodes. The circuit provides averaging of gain and offset errors of the multiple signal paths. Circuit parasitics associated with reconfigurability are relatively small, resulting in a high-performance, power-efficient implementation.

In the implementations shown in FIGS. 4A-7B, a mismatch between paths and an accumulation of gain and offset errors between paths can occur prior to analog signal addition in the multiple-input signal-averaging MDAC. Small errors can be absorbed by analog overrange and digital error correction capability of the MDAC stages. Accumulation of large gain and offset errors, however, can result in substantial ADC errors if the analog overrange and digital error correction ranges are exceeded.

One way to address this issue is to re-combine the multiple signal paths at the output of each MDAC stage. This architecture variation is referred to as fully interleaved multi-path architecture. A 2-stage, 2-path implementation is described with reference to FIGS. 8A and 8B below. This implementation is similar to the 2-stage, 2-path implementation shown and described with reference to FIGS. 4A-7B except that the signal is recombined at the output of stage 1 prior to splitting back into 2 paths in stage 2. This is done using a multiple-input signal-averaging MDAC at stage 2 in addition to stage 3 as described with reference to FIG. 8B below. This is only slightly more complex, requiring additional input selection switches in the MDAC in stage 2. This does not require additional power and provides the same SNR improvement of the non-fully interleaved implementation described with reference to FIGS. 4A-7B while addressing the gain and offset accumulation issue.

Figure 8A:
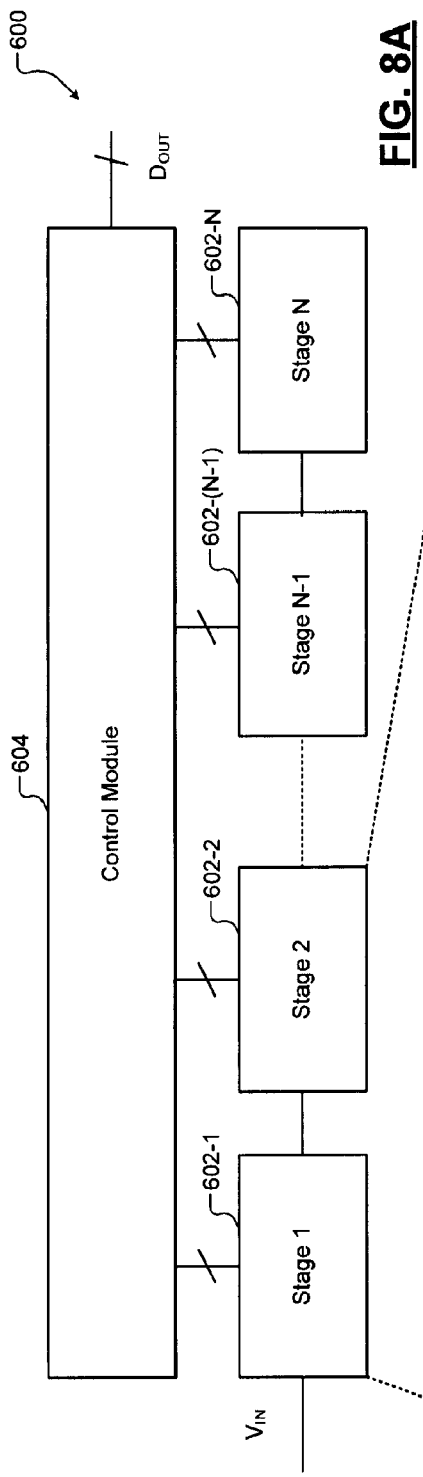
FIG. 8A is a functional block diagram of a pipeline ADC that uses a plurality of conversion paths and a multiple-input signal-averaging MDAC in one or more of a plurality of conversion stages.
Figure 8B:
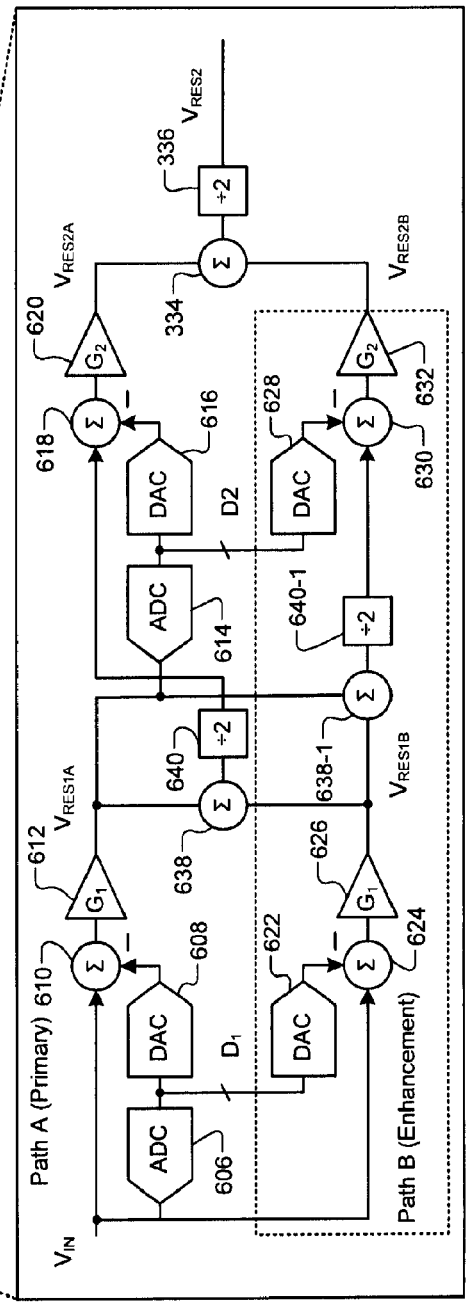
FIG. 8B is a functional block diagram of a plurality of conversion stages of the pipeline ADC of FIG. 8A.

Referring now to FIGS. 8A and 8B, a fully interleaved multi-path pipeline ADC 600 according to the present disclosure is shown. In FIG. 8A, the pipeline ADC 600 includes N stages connected in a pipeline configuration. The N stages of the pipeline ADC 300 include stage 1 602-1, stage 2 602-2, ..., and stage N 602-N, where N is an integer greater than 1 (collectively stages 602). Additionally, the pipeline ADC 600 includes a control module 604 that time aligns (i.e., synchronizes) and adds bits output by the stages 602 and generates the output of the pipeline ADC 600.

In FIG. 8B, the stages 1 and 2 of the pipeline ADC 600 are shown in detail. The implementation shown provides 2 analog signal paths through the first 2 stages of the pipeline ADC 600 for example only. These signal paths are referred to as the primary path (Path A) and enhancement path (Path B). The control module 604 can switch off the enhancement path to reduce power consumption at lower overall SNR. When the enhancement path is switched off, the control module 604 bypasses the sum and divide-by-two functions, and the first and second residues are taken directly from the primary path stage 1 and stage 2 outputs, respectively.

The stages 1 and 2 of the pipeline ADC 600 include the following components. In the primary path, the stage 1 602-1 includes a first ADC 606, a first DAC 608, a first subtractor 610, and a first amplifier 612. A first MDAC implements the first DAC 608, the first subtractor 610, and the first amplifier 612. The stage 2 602-2 includes a second ADC 614, a second DAC 616, a second subtractor 618, and a second amplifier 620. A second MDAC implements the second DAC 616, the second subtractor 618, and the second amplifier 620. In the enhancement path, the stage 1 602-1 includes a third DAC 622, a third subtractor 624, and a third amplifier 626. A third MDAC implements the third DAC 622, the third subtractor 624, and the third amplifier 626. The stage 2 602-2 includes a fourth DAC 628, a fourth subtractor 630, and a fourth amplifier 632. A fourth MDAC implements the fourth DAC 628, the fourth subtractor 630, and the fourth amplifier 632.

An adder 638 and a divider 640 recombine the two paths at the output of the stage 1 establishing the primary path of stage 2. The adder 638, the divider 640, and the second MDAC comprising the second DAC 616, the second subtractor 618, and the second amplifier 620 constitute a first multiple-input signal-averaging MDAC. An adder 638-1 and a divider 640-1 recombine the two paths at the output of the stage 1 establishing the enhancement path of stage 2. The adder 638-1, the divider 640-1, and the fourth MDAC comprising the fourth DAC 628, the fourth subtractor 630, and the fourth amplifier 632 constitute a second multiple-input signal-averaging MDAC. An adder 634 and a divider 636 recombine the two paths at the output of the stage 2. The adder 634, the divider 636, and an MDAC (i.e., DAC, subtractor, and amplifier) of the following stage (e.g., stage 3) constitute a third multiple-input signal-averaging MDAC.

In the stage 1, in the primary path, the first ADC 606 receives the input signal of the pipeline ADC 600. The output of the first ADC 606 is input to the first DAC 608. The first subtractor 610 subtracts the output of the first DAC 608 from the input of the pipeline ADC 600. The first amplifier 612 amplifies the output of the first subtractor 610 and generates a first residue of the stage 1 602-1. In the enhancement path, the third DAC 622 receives the output of the first ADC 606. The third subtractor 624 subtracts the output of the third DAC 622 from the input of the pipeline ADC 600. The third amplifier 626 amplifies the output of the third subtractor 624 and generates a third residue of the stage 1 602-1. The first multiple-input signal-averaging MDAC including an adder 638 and a divider 640 recombine the first residue of the stage 1 602-1 in the primary path and the third residue of the stage 1 602-1 in the enhancement path at the output of the stage 1. The second multiple-input signal-averaging MDAC including the adder 638-1 and the divider 640-1 recombine the first residue of the stage 1 602-1 in the primary path and the third residue of the stage 1 602-1 in the enhancement path at the output of the stage 1.

In the stage 2, in the primary path, the second ADC 614 receives the first residue of the stage 1 602-1. The output of the second ADC 614 is input to the second DAC 616. The second subtractor 618 subtracts the output of the second DAC 616 from the output of the divider 640. In a single-path configuration, the second subtractor 618 subtracts the output of the second DAC 616 from the first residue of the stage 1 602-1. The second amplifier 620 amplifies the output of the second subtractor 618 and generates a second residue of the stage 2 602-2.

In the enhancement path, the fourth DAC 628 receives the output of the second ADC 614. The fourth subtractor 630 subtracts the output of the fourth DAC 628 from the output of the divider 640-1. The fourth amplifier 626 amplifies the output of the fourth subtractor 630 and generates a fourth residue of the stage 2 602-2. The third multiple-input signal-averaging MDAC including the adder 634 and a divider 636 recombines the second residue of the stage 2 602-2 in the primary path and the fourth residue of the stage 2 602-2 in the enhancement path at the output of the stage 2.

When the multi-path pipeline ADC is configured for two (or more) paths, the loading on the reference circuit is increased and settling time decreases, resulting in a reduced maximum sample rate. This effect can be mitigated by implementing a programmable reference circuit that compensates for the increased load of the multiple path configuration, maintaining a constant settling time and maximum sample rate.

Figure 9:
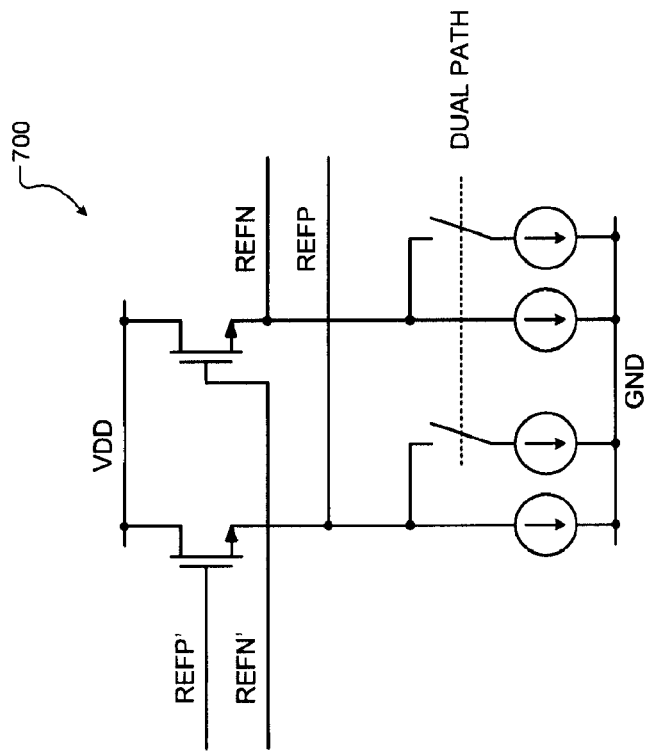
FIG. 9 is a schematic of a programmable ADC reference buffer.

Referring now to FIG. 9, a programmable ADC reference buffer 700 is shown. The programmable ADC reference buffer 700 uses a source follower buffer reference. The programmable ADC reference buffer 700 provides a programmable bias current to the pipeline ADCs shown in FIGS. 4A-8B based on the number of paths used in the pipeline ADCs. The outputs REFN and REFP represent the references VREF0 and VREF1 shown in FIGS. 5B and 6B. The control modules 304 or 604 control the switches of the programmable ADC reference buffer 700 when the programmable ADC reference buffer 700 is used with the pipeline ADC 300 or 600, respectively.

When the multi-path pipeline ADC is configured for two (or more) paths, the input sampling capacitance increases proportionately. This variable input impedance can result in signal degradation at the input interface of the multi-path pipeline ADC as the sampling capacitance load increases. If the input driver of the multi-path pipeline ADC is designed for optimal performance at the maximum load condition, the input driver most likely consumes excess power when the multi-path pipeline ADC operates in reduced or single path configurations. Furthermore, when a single driver provides the input for multiple paths, the driver noise will be correlated in all the paths.

Figure 10B:
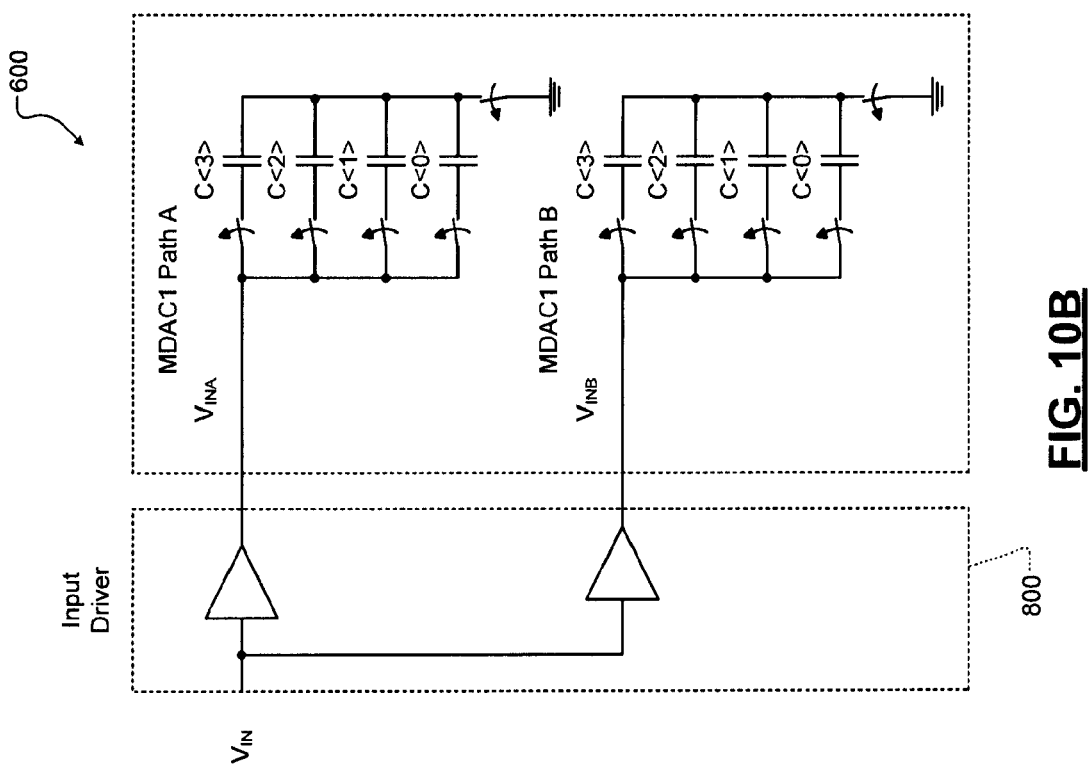
FIG. 10B is a schematic showing the input driver with sampling capacitor loading.
Figure 10A:
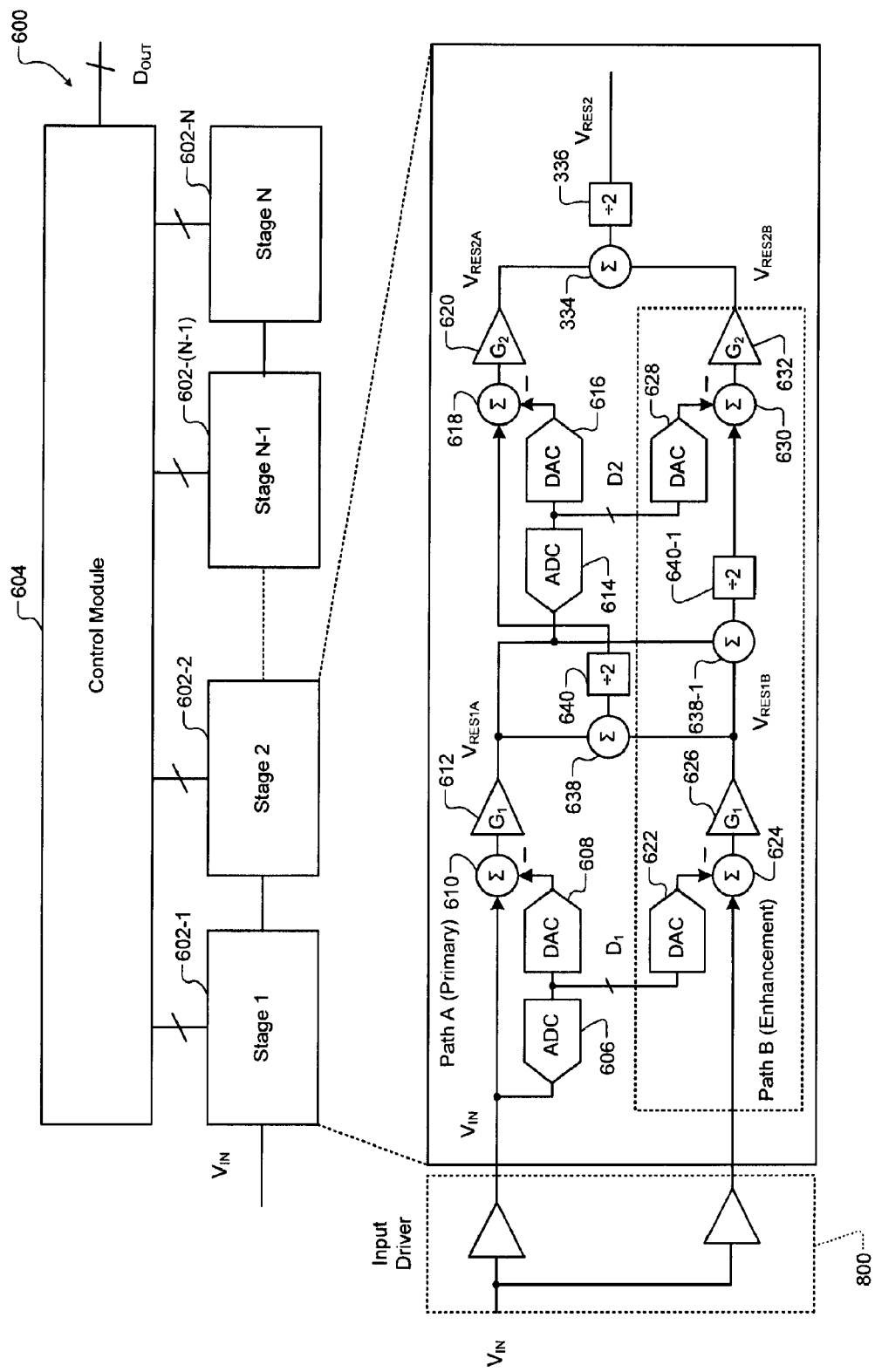
FIG. 10A is a functional block diagram of a pipeline ADC that uses a plurality of conversion paths and that employs an input driver to adapt to load variation due to reconfiguration of the pipeline ADC.

Referring now to FIGS. 10A and 10B, a multi-path input driver circuit that provides optimal power/performance and uncorrelated noise is shown. In FIG. 10A, an overall architecture including the pipeline ADC 600 and the multi-path input driver circuit 800 is shown. In FIG. 10B, the ADC input sampling capacitor loading is shown. As can be seen from the schematic, each driver has a nearly constant load regardless of the multiple path configuration selected. If the driver is a unity gain open loop circuit or low gain feedback circuit, excellent path matching, which is required for the multi-path reconfigurable pipeline ADC, is easily achieved. When an ADC path is disabled, the associated driver circuit can be disabled as well, resulting in the same power/performance scaling of the ADC. The control modules 304 or 604 control the drivers when the drivers are used with the pipeline ADC 300 or 600, respectively.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. As used herein, the phrase at least one of A, B, and C should be construed to mean a logical (A or B or C), using a non-exclusive logical OR. It should be understood that one or more steps within a method may be executed in different order (or concurrently) without altering the principles of the present disclosure.

In this application, including the definitions below, the term module may be replaced with the term circuit. The term module may refer to, be part of, or include an Application Specific Integrated Circuit (ASIC); a digital, analog, or mixed analog/digital discrete circuit; a digital, analog, or mixed analog/digital integrated circuit; a combinational logic circuit; a field programmable gate array (FPGA); a processor (shared, dedicated, or group) that executes code; memory (shared, dedicated, or group) that stores code executed by a processor; other suitable hardware components that provide the described functionality; or a combination of some or all of the above, such as in a system-on-chip.

The term code, as used above, may include software, firmware, and/or microcode, and may refer to programs, routines, functions, classes, and/or objects. The term shared processor encompasses a single processor that executes some or all code from multiple modules. The term group processor encompasses a processor that, in combination with additional processors, executes some or all code from one or more modules. The term shared memory encompasses a single memory that stores some or all code from multiple modules. The term group memory encompasses a memory that, in combination with additional memories, stores some or all code from one or more modules. The term memory may be a subset of the term computer-readable medium. The term computer-readable medium does not encompass transitory electrical and electromagnetic signals propagating through a medium, and may therefore be considered tangible and non-transitory. Non-limiting examples of a non-transitory tangible computer readable medium include nonvolatile memory, volatile memory, magnetic storage, and optical storage.

The apparatuses and methods described in this application may be partially or fully implemented by one or more computer programs executed by one or more processors. The computer programs include processor-executable instructions that are stored on at least one non-transitory tangible computer readable medium. The computer programs may also include and/or rely on stored data.

What is claimed is:

1. A pipeline analog-to-digital converter (ADC) comprising:
   a first conversion stage of the pipeline ADC that receives an input signal and that comprises
      in a first signal path:
         a first ADC that converts the input signal,
         a first digital-to-analog converter (DAC) that converts an output of the first ADC,
         a first subtractor that subtracts an output of the first DAC from the input signal, and
         a first amplifier that amplifies an output of the first subtractor and generates a first residue of the first conversion stage; and
      in a second signal path:
         a second DAC that converts the output of the first ADC,
         a second subtractor that subtracts an output of the second DAC from the input signal, and
         a second amplifier that amplifies an output of the second subtractor and generates a second residue of the first conversion stage; and
   a control module that selectively enables and disables the second path.

2. The pipeline ADC of claim 1 further comprising a second conversion stage of the pipeline ADC that comprises:
   in the first signal path:
      a second ADC that converts the first residue,
      a third DAC that converts an output of the second ADC,
      a third subtractor that subtracts an output of the third DAC from the first residue, and
      a third amplifier that amplifies an output of the third subtractor and generates a third residue of the second conversion stage; and in the second signal path:
a fourth DAC that converts the output of the second ADC when the control module enables the second path,
a fourth subtractor that subtracts an output of the fourth DAC from the second residue, and
a fourth amplifier that amplifies an output of the fourth subtractor and generates a fourth residue of the second conversion stage.

3. The pipeline ADC of claim 2 further comprising:
a first adder that adds the third residue and the fourth residue when the control module enables the second path; and
a first divider that divides an output of the first adder.

4. The pipeline ADC of claim 3 further comprising a third conversion stage of the pipeline ADC that comprises:
a third ADC that converts an output of the first divider;
a fifth DAC that converts an output of the third ADC;
a fifth subtractor that subtracts an output of the fifth DAC from the output of the first divider; and
a fifth amplifier that amplifies an output of the fifth subtractor and generates a fifth residue of the third conversion stage,
wherein the control module generates a digital representation of the input signal based on the outputs of the first, second, and third ADCs.

5. The pipeline ADC of claim 2 further comprising a third conversion stage of the pipeline ADC that comprises:
a third ADC that converts an output of the third amplifier when the control module disables the second path;
a fifth DAC that converts an output of the third ADC;
a fifth subtractor that subtracts an output of the fifth DAC from the output of the third amplifier; and
a fifth amplifier that amplifies an output of the fifth subtractor and generates a fifth residue of the third conversion stage,
wherein the control module generates a digital representation of the input signal based on the outputs of the first, second, and third ADCs.

6. The pipeline ADC of claim 1 further comprising:
a first adder that adds the first residue and the second residue when the control module enables the second path;
a first divider that divides an output of the first adder;
a second adder that adds the first residue and the second residue when the control module enables the second path; and
a second divider that divides an output of the second adder.

7. The pipeline ADC of claim 6 further comprising a second conversion stage of the pipeline ADC that comprises:
in the first signal path:
a second ADC that converts an output of the first amplifier,
a third DAC that converts an output of the second ADC,
a third subtractor that subtracts an output of the third DAC from the output of the first divider, and
a third amplifier that amplifies an output of the third subtractor and generates a third residue of the second conversion stage; and
in the second signal path:
a fourth DAC that converts the output of the second ADC,
a fourth subtractor that subtracts an output of the fourth DAC from the output of the second divider, and
a fourth amplifier that amplifies an output of the fourth subtractor and generates a fourth residue of the second conversion stage.

8. The pipeline ADC of claim 7 further comprising:
a third adder that adds the third residue and the fourth residue; and
a third divider that divides an output of the third adder.

9. The pipeline ADC of claim 8 further comprising a third conversion stage of the pipeline ADC that comprises:
a third ADC that converts an output of the third divider;
a fifth DAC that converts an output of the third ADC;
a fifth subtractor that subtracts an output of the fifth DAC from the output of the third divider; and
a fifth amplifier that amplifies an output of the fifth subtractor and generates a fifth residue of the third conversion stage,
wherein the control module generates a digital representation of the input signal based on the outputs of the first, second, and third ADCs.

10. A system comprising:
a sampling circuit including
a plurality of capacitances, wherein each of the capacitances has a first end connected to a common potential, and a second end; and
a plurality of switches;
an active charge transfer circuit having a first input connected to the common potential, a second input, and an output; and
a control module that controls the plurality of switches,
wherein during a sampling phase, the plurality of switches connects a first signal to a first set of the capacitances, and a second signal to a second set of the capacitances; and
wherein during an amplifying phase following the sampling phase, the plurality of switches disconnects the first and second signals from the first and second sets of the capacitances, connects a plurality of reference voltages to the second input of the active charge transfer circuit via a third set of the capacitances, and connects a fourth set of the capacitances to the second input and the output of the active charge transfer circuit.

11. The system of claim 10 wherein the output of the active charge transfer circuit includes an average of the first and second signals.

12. The system of claim 10 further comprising a conversion stage of a pipeline analog-to-digital converter (ADC) that includes two conversion paths and that generates the first and second signals representing two residues of the conversion stage via the two conversion paths.

13. The system of claim 12 wherein the control module disables one of the two conversion paths and connects one of the first and second signals to the plurality of capacitances.

14. A pipeline analog-to-digital converter (ADC) comprising:
a first conversion stage that includes two conversion paths, that converts an input signal via the two conversion paths, and that generates a first output and first and second residues;
a second conversion stage that includes two conversion paths and that generates a second output and third and fourth residues via the two conversion paths based on the first and second residues;
a first adder that adds the third and fourth residues;
a first divider that divides an output of the first adder;
a third conversion stage that generates a third output based on an output of the first divider; and
a control module that generates a digital representation of the input signal based on the outputs of the first, second, and third conversion stages.

15. The pipeline ADC of claim 14 further comprising:
a second adder that adds the first and second residues;
a second divider that divides an output of the second adder;
a third adder that adds the first and second residues; and
a third divider that divides an output of the second adder,
wherein the second conversion stage includes a first ADC that generates the second output based on the first residue, a first multiplying DAC that generates the third residue based on the second output and an output of the second divider, and a second multiplying DAC that generates the fourth residue based on the second output and an output of the third divider.

16. The pipeline ADC of claim 14 wherein the first conversion stage includes a first ADC that generates the first output based on the input signal, a first multiplying DAC that generates the first residue based on the first output and the input signal, and a second multiplying DAC that generates the second residue based on the input signal.

* * * * *

UNITED STATES PATENT AND TRADEMARK OFFICE
CERTIFICATE OF CORRECTION

PATENT NO. : 8,779,963 B1  Page 1 of 1
APPLICATION NO. : 13/796592
DATED : July 15, 2014
INVENTOR(S) : James Edward Bales It is certified that error appears in the above-identified patent and that said Letters Patent is hereby corrected as shown below:

Title Page, Column 1,

(73) Assignee, Line 1   Delete "Maxin" and insert --Maxim--

In the Illustrative Figure 4B   Delete "330" and insert --332--

Also in Figure 4B label the summing block "330"

In the Drawings:

Sheet 3 of 8, Reference
Numeral 330, FIG. 4B   Delete "330" and insert --332--

Sheet 3 of 8, FIG. 4B   Label the summing block "330"

In the Specification:

Column 8, Line 42   Delete "326" and insert --332--

Column 12, Line 61   Delete "626" and insert --632--

Signed and Sealed this
Fourth Day of November, 2014

Michelle K. Lee
*Deputy Director of the United States Patent and Trademark Office*